US012004376B2

(12) United States Patent
Han et al.

(10) Patent No.: US 12,004,376 B2
(45) Date of Patent: Jun. 4, 2024

(54) DISPLAY MOTHERBOARD, PREPARATION METHOD THEREOF, DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Yi Zhang, Beijing (CN); Guangzhou Zhao, Beijing (CN); Yiyang Zhang, Beijing (CN); Yuqing Yang, Beijing (CN); Tingliang Liu, Beijing (CN); Pengfei Yu, Beijing (CN); Yang Zhou, Beijing (CN); Qun Ma, Beijing (CN); Xiping Li, Beijing (CN); Shikai Qin, Beijing (CN); Weiyun Huang, Beijing (CN); Yue Long, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 457 days.

(21) Appl. No.: 17/414,332

(22) PCT Filed: Dec. 29, 2020

(86) PCT No.: PCT/CN2020/140685
§ 371 (c)(1),
(2) Date: Jun. 16, 2021

(87) PCT Pub. No.: WO2021/169568
PCT Pub. Date: Sep. 2, 2021

(65) Prior Publication Data
US 2022/0310722 A1    Sep. 29, 2022

(30) Foreign Application Priority Data

Feb. 27, 2020 (CN) .................... 202010123204.X

(51) Int. Cl.
*H10K 59/122* (2023.01)
*H10K 50/84* (2023.01)
(Continued)

(52) U.S. Cl.
CPC ........... *H10K 59/122* (2023.02); *H10K 50/84* (2023.02); *H10K 71/00* (2023.02); *H10K 59/1201* (2023.02)

(58) Field of Classification Search
CPC ...... H10K 59/122; H10K 50/84; H10K 71/00; H10K 59/1201; H10K 59/131;
(Continued)

(56) References Cited

U.S. PATENT DOCUMENTS

| 2008/0158482 A1 | 7/2008 | Jang et al. |
| 2015/0059986 A1* | 3/2015 | Komatsu ........... C03B 33/07 83/872 |
| 2017/0090228 A1* | 3/2017 | Ishikawa ........... G02F 1/136286 |

FOREIGN PATENT DOCUMENTS

| CN | 101236336 A | 8/2008 |
| CN | 104752439 A | 7/2015 |

(Continued)

OTHER PUBLICATIONS

International Search Report for PCT/CN2020/140685 dated Mar. 25, 2021.

*Primary Examiner* — Yasser A Abdelaziez
(74) *Attorney, Agent, or Firm* — Ling Wu; Stephen Yang; Ling and Yang Intellectual Property

(57) ABSTRACT

Provided are a display motherboard, a preparation method thereof, a display substrate and a display device. The display motherboard includes a plurality of display substrate regions
(Continued)

and a cutting region located at a periphery of each of the plurality of display substrate regions; the display motherboard includes a driving structure layer arranged in each of the plurality of display substrate regions and a marking structure layer arranged in each cutting region, wherein the marking structure layer includes a cutting mark layer; and a planarization layer arranged on the driving structure layer and the marking structure layer, and covering the marking structure layer.

13 Claims, 7 Drawing Sheets

(51) Int. Cl.
*H10K 71/00* (2023.01)
*H10K 59/12* (2023.01)

(58) Field of Classification Search
CPC .. H10K 71/851; H10K 50/844; H10K 59/123; H10K 59/124; H10K 59/12; G09F 9/30; G09F 9/301; H01L 23/544; H01L 2223/5442
See application file for complete search history.

(56) References Cited

FOREIGN PATENT DOCUMENTS

| | | |
|---|---|---|
| CN | 108089770 A | 5/2018 |
| CN | 109491162 A | 3/2019 |
| CN | 211125656 U | 7/2020 |
| JP | 2019-124745 A | 7/2019 |

* cited by examiner

DISPLAY MOTHERBOARD, PREPARATION METHOD THEREOF, DISPLAY SUBSTRATE AND DISPLAY DEVICE

The present application claims the priority of Chinese patent application No. 202010123204, filed to the CNIPA on Feb. 27, 2020 and entitled "Display Motherboard, Preparation Method Thereof, Display Substrate and Display Device", the content of which should be regarded as being incorporated herein by reference.

TECHNICAL FIELD

The present disclosure relates to, but is not limited to, the technical field of display, in particular to a display motherboard, a preparation method thereof, a display substrate and a display device.

BACKGROUND

An Organic Light Emitting Diode (abbreviated as OLED) is an active light emitting display component, and has advantages of self-light-emission, wide viewing angle, high contrast, low power consumption and extremely high response speed. With the continuous development of display technology, the OLED technology is increasingly applied in flexible display devices.

In the process of preparing a flexible OLED display device, a display motherboard is firstly prepared, and then the display motherboard is cut, so that the display motherboard is divided into a plurality of display substrates, and each of the separated display substrates can be used for forming a single OLED display device. FIG. 1 is a schematic diagram showing an arrangement of a plurality of display substrates included in a display motherboard. As shown in FIG. 1, a plurality of display substrate regions 300 on the display motherboard 100 are periodically and regularly arranged, and a cutting region 400 is located at a periphery of each display substrate region 300. The display substrate region 300 includes at least a display region 301 and a binding region 302, the display region 301 includes a plurality of pixels arranged in a matrix, the binding region 302 includes a driving circuit 303, and the binding region 302 is arranged on one side of the display region 301. The cutting region 400 includes an annular cutting line 401 surrounding the display substrate region 300 and a plurality of cutting marks 402.

When cutting, the cutting equipment first identifies the cutting marks and then cuts according to the cutting marks, but there is a problem that the cutting marks cannot be identified in production.

SUMMARY

The following is a summary of subject matter described in detail herein. This summary is not intended to limit the protection scope of the claims.

The present disclosure provides a display motherboard, including a plurality of display substrate regions and a cutting region located at a periphery of each of the plurality of display substrate regions; the display motherboard further includes:

a driving structure layer arranged in each of the plurality of display substrate regions and a marking structure layer arranged in each cutting region, wherein the marking structure layer includes a cutting mark layer; and a planarization layer arranged on the driving structure layer and the marking structure layer, and covering the marking structure layer.

In some possible implementations, the driving structure layer includes a first source-drain metal layer, and the marking structure layer includes a cutting mark layer, which is arranged on the same layer as the first source-drain metal layer.

In some possible implementations, the driving structure layer further includes: a first insulating layer arranged on a base substrate, an active layer arranged on the first insulating layer, a second insulating layer covering the active layer, a first gate metal layer arranged on the second insulating layer, a third insulating layer covering the first gate metal layer, a second gate metal layer arranged on the third insulating layer, and a fourth insulating layer covering the second gate metal layer, wherein the first source-drain metal layer is arranged on the fourth insulating layer; and the marking structure layer further includes: a first insulating layer, a second insulating layer, a third insulating layer and a fourth insulating layer which are stacked on the base substrate; and the cutting mark layer is arranged on the fourth insulating layer.

In some possible implementations, the display motherboard further includes a fifth insulating layer. In the display substrate region, the fifth insulating layer is arranged on the driving structure layer; and in the cutting region, the fifth insulating layer is arranged on the marking structure layer, and the planarization layer is arranged on the fifth insulating layer.

In some possible implementations, the planarization layer includes a second planarization layer arranged on the fifth insulating layer and a pixel definition layer arranged on the second planarization layer; and an anode is further arranged between the second planarization layer and the pixel definition layer in the display substrate region.

In some possible implementations, the driving structure layer includes a second source-drain metal layer, and the marking structure layer includes a cutting mark layer, which is arranged on the same layer as the second source-drain metal layer.

In some possible implementations, the driving structure layer further includes: a first insulating layer arranged on a base substrate, an active layer arranged on the first insulating layer, a second insulating layer covering the active layer, a first gate metal layer arranged on the second insulating layer, a third insulating layer covering the first gate metal layer, a second gate metal layer arranged on the third insulating layer, a fourth insulating layer covering the second gate metal layer, a first source-drain metal layer arranged on the fourth insulating layer, and a fifth insulating layer and a first planarization layer covering the first source-drain metal layer, wherein the second source-drain metal layer is arranged on the first planarization layer; the marking structure layer further includes a first insulating layer, a second insulating layer, a third insulating layer, a fourth insulating layer, a fifth insulating layer and a first planarization layer which are stacked on the base substrate, and the cutting mark layer is arranged on the first planarization layer.

In some possible implementations, the planarization layer includes a second planarization layer covering the driving structure layer and the marking structure layer and a pixel definition layer arranged on the second planarization layer; an anode is further arranged between the second planarization layer and the pixel definition layer in the display substrate region.

In some possible implementations, the display motherboard further includes a protective film; in the display substrate region, an encapsulation layer is arranged on the planarization layer, and the protective film is arranged on the encapsulation layer; and in the cutting region, the protective film is arranged on the planarization layer.

In some possible implementations, the cutting mark layer of the cutting region includes a plurality of cutting marks, and the cutting marks include four rectangular patterns arranged in two rows and two columns.

The present disclosure further provides a display substrate formed by cutting the display motherboard along the cutting region.

The present disclosure further provides a display device, including the aforementioned display substrate.

The present disclosure further provides a preparation method of a display motherboard, wherein the display motherboard includes a plurality of display substrate regions and a cutting region located at a periphery of each of the plurality of display substrate regions; the preparation method includes steps of:

respectively forming a driving structure layer and a marking structure layer in the plurality of display substrate regions and the cutting region, wherein the marking structure layer includes a cutting mark layer; and forming a planarization layer on the driving structure layer and the marking structure layer, wherein the planarization layer covers the marking structure layer.

In some possible implementations, the driving structure layer includes a first source-drain metal layer, and the marking structure layer includes a cutting mark layer. The step of respectively forming the driving structure layer and the marking structure layer in the plurality of display substrate regions and the cutting region includes:

forming a first insulating layer on a base substrate, forming an active layer on the first insulating layer, forming a second insulating layer covering the active layer, forming a first gate metal layer on the second insulating layer, forming a third insulating layer covering the first gate metal layer, forming a second gate metal layer on the third insulating layer, forming a fourth insulating layer covering the second gate metal layer, and forming the first source-drain metal layer and the cutting mark layer on the fourth insulating layer by the same patterning process; wherein the active layer, the first gate metal layer, the second gate metal layer and the first source-drain metal layer are arranged in the display substrate region, and the cutting mark layer is arranged in the cutting region.

In some possible implementations, the step of forming the planarization layer on the driving structure layer and the marking structure layer includes:

forming a fifth insulating film on the driving structure layer and the marking structure layer; and forming a second planarization layer and a pixel definition layer sequentially on the fifth insulating layer, wherein an anode is further formed between the second planarization layer and the pixel definition layer in the display substrate region.

In some possible implementations, the driving structure layer includes a second source-drain metal layer, and the marking structure layer includes a cutting mark layer. The step of respectively forming the driving structure layer and the marking structure layer in the plurality of display substrate regions and the cutting region includes:

forming a first insulating layer on a base substrate, forming an active layer on the first insulating layer, forming a second insulating layer covering the active layer, forming a first gate metal layer on the second insulating layer, forming a third insulating layer covering the first gate metal layer, forming a second gate metal layer on the third insulating layer, forming a fourth insulating layer covering the second gate metal layer, forming the first source-drain metal layer on the fourth insulating layer, forming a fifth insulating layer covering the first source-drain metal layer, forming a first planarization layer on the fifth insulating layer, and forming the second source-drain metal layer and the cutting mark layer on the first planarization layer by the same patterning process; wherein the active layer, the first gate metal layer, the second gate metal layer, the first source-drain metal layer and the second source-drain metal layer are arranged in the display substrate region, and the cutting mark layer is arranged in the cutting region.

In some possible implementations, the step of forming the planarization layer on the driving structure layer and the marking structure layer includes:

forming a second planarization layer and a pixel definition layer sequentially on the first planarization layer, wherein an anode is further formed between the second planarization layer and the pixel definition layer in the display substrate region.

In some possible implementations, the preparation method further includes:

sequentially forming an organic light-emitting layer, a cathode and an encapsulation layer;

attaching a protective film on the encapsulation layer, wherein the protective film is in contact with the pixel definition layer in the cutting region;

attaching a back film on a surface of one side of the base substrate away from the planarization layer in a roller attaching mode; and cutting the display motherboard to form a plurality of display substrates.

In some possible implementations, after cutting the display motherboard, the preparation method further includes:

removing the protective film; and forming a cover plate on the encapsulation layer; or sequentially forming a touch control layer and a cover plate on the encapsulation layer.

Other aspects will become apparent upon reading and understanding accompanying drawings and the detailed description.

BRIEF DESCRIPTION OF DRAWINGS

The attached drawings are for providing a further understanding of the technical scheme of the present disclosure and constitute a part of the description. They are for explaining the technical scheme of the present disclosure together with the embodiments of the present application and do not constitute a limitation on the technical scheme of the present disclosure. Shapes and sizes of various components in the drawings do not reflect true scales and are intended to illustrate schematically contents of the present disclosure only.

DESCRIPTION OF REFERENCE SIGNS

Figure 1:
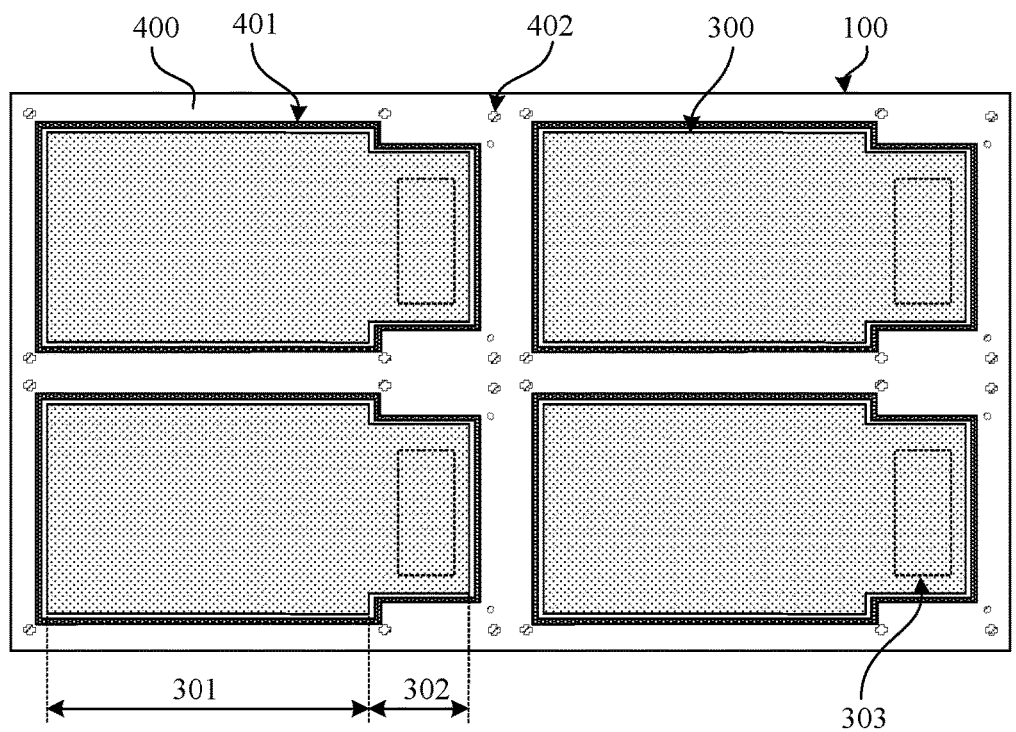
FIG. 1 is a schematic diagram showing an arrangement of a plurality of display substrates included in a display motherboard.

| 1-glass carrier plate; | 2-back film; | 10-base substrate; |
|---|---|---|
| 11-first insulating layer; | 12-active Layer; | 13-second insulating layer; |
| 14-gate electrode; | 15-first capacitor electrode; | 16-third insulating layer; |
| 17-second capacitor electrode; | 18-fourth insulating layer; | 19A-source electrode; |
| 19B-drain electrode; | 20-fifth insulating layer; | 21-planarization layer; |
| 21A-first planarization layer; | 22-anode; | 23-pixel definition layer; |
| 24-organic light-emitting layer; | 25-cathode; | 26-encapsulation layer; |
| 27-protective film; | 40-marking block; | 100-display motherboard; |
| 101-thin film transistor; | 102-storage capacitor; | 103-connection electrode; |
| 300-display substrate region; | 301-display region; | 302-binding region; |
| 303-driving circuit; | 400-cutting region; | 401-cutting line; and |
| 402-cutting marks. | | |

DETAILED DESCRIPTION

To make the objects, technical solutions and advantages of the present disclosure more clear, embodiments of the present disclosure will be described in detail below with reference to the drawings. The embodiments may be implemented in a number of different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated for clarity. Therefore, an implementation of the present disclosure is not necessarily limited to the size shown, and the shapes and sizes of the components in the drawings do not reflect true proportions. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientational or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. In this specification, a channel region refers to a region which current mainly flows through.

In this specification, it may be the case that a first electrode is a drain electrode and a second electrode is a source electrode, and it may also be the case that a first electrode is a source electrode and a second electrode is a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10o and below 10o, and thus also includes a case where the angle is above −5o and below 5o. In addition, "perpendicular" refers to a case where an angle formed by two straight lines is above −80o and below 100o, and thus also includes a case where the angle is above −85o and below 95o.

In this specification, "film" and "layer" may be interchangeable. For example, sometimes "conductive layer" may be replaced by "conductive film". Similarly, "insulating film" may sometimes be replaced by "insulating layer".

Through research, it is found that there is a problem that the cutting marks in the cutting region cannot be identified in the production, which is caused by bubbles that appear in the cutting region during the preparation process and block the cutting marks. When a plurality of bubbles with irregular shapes are located in the region where the cutting marks are located, the contour lines of the bubbles would affect the accuracy of judging the shape of the cutting marks by the cutting equipment, which leads to the situation that the cutting equipment cannot identify the cutting marks. After further study, it is found that the bubbles in the cutting region are mainly produced in the process of attaching the back film. A preparation process of the display motherboard includes: preparing a flexible base substrate on a rigid substrate firstly, and preparing corresponding film layer structures on the flexible base substrate to form the display motherboard. After all the film layers are prepared, the display motherboard is stripped off from the rigid base substrate by a lift-off process, and then a back film is attached to the back of the flexible base substrate (the surface on the side away from the film layer structure) to protect the flexible base substrate. When the back film is attached with the roller, the soft flexible base substrate is deformed under the pressure of the roller, and bubbles are generated at the position with large deformation due to extrusion.

The present disclosure further provides a display motherboard, wherein on a plane parallel to the display motherboard, the display motherboard includes a plurality of display substrate regions and a cutting region located at a periphery of each of the plurality of display substrate regions; and on a plane perpendicular to the display motherboard, the display motherboard includes:

a driving structure layer arranged in each of the plurality of display substrate regions and a marking structure layer arranged in each cutting region, wherein the marking structure layer includes a cutting mark layer; and a planarization layer arranged on the driving structure layer and the marking structure layer, and covering the marking structure layer.

In an exemplary embodiment, the driving structure layer includes a first source-drain metal layer, and the marking structure layer includes a cutting mark layer arranged on the same layer as the first source-drain metal layer.

In an exemplary embodiment, the driving structure layer further includes: a first insulating layer arranged on a base substrate, an active layer arranged on the first insulating layer, a second insulating layer covering the active layer, a first gate metal layer arranged on the second insulating layer, a third insulating layer covering the first gate metal layer, a second gate metal layer arranged on the third insulating layer, and a fourth insulating layer covering the second gate metal layer, wherein the first source-drain metal layer is arranged on the fourth insulating layer; and the marking structure layer further includes: a first insulating layer, a second insulating layer, a third insulating layer and a fourth insulating layer which are stacked on the base substrate, and the cutting mark layer is arranged on the fourth insulating layer.

In an exemplary embodiment, the display motherboard further includes a fifth insulating layer. In the display substrate region, the fifth insulating layer is arranged on the driving structure layer; and in the cutting region, the fifth insulating layer is arranged on the marking structure layer, and the planarization layer is arranged on the fifth insulating layer.

In an exemplary embodiment, the planarization layer includes a second planarization layer arranged on the fifth insulating layer and a pixel definition layer arranged on the second planarization layer; and an anode is further arranged between the second planarization layer and the pixel definition layer in the display substrate region.

In an exemplary embodiment, the driving structure layer includes a second source-drain metal layer, and the marking structure layer includes a cutting mark layer, which is arranged on the same layer as the second source-drain metal layer.

In an exemplary embodiment, the driving structure layer further includes: a first insulating layer arranged on a base substrate, an active layer arranged on the first insulating layer, a second insulating layer covering the active layer, a first gate metal layer arranged on the second insulating layer, a third insulating layer covering the first gate metal layer, a second gate metal layer arranged on the third insulating layer, a fourth insulating layer covering the second gate metal layer, a first source-drain metal layer arranged on the fourth insulating layer, and a fifth insulating layer and a first planarization layer covering the first source-drain metal layer, wherein the second source-drain metal layer is arranged on the first planarization layer; the marking structure layer further includes a first insulating layer, a second insulating layer, a third insulating layer, a fourth insulating layer, a fifth insulating layer and a first planarization layer which are stacked on the base substrate, and the cutting mark layer is arranged on the first planarization layer.

In an exemplary embodiment, the planarization layer includes a second planarization layer covering the driving structure layer and the marking structure layer and a pixel definition layer arranged on the second planarization layer; an anode is further arranged between the second planarization layer and the pixel definition layer in the display substrate region.

In an exemplary embodiment, the display motherboard further includes a protective film; in the display substrate region, an encapsulation layer is arranged on the planarization layer, and the protective film is arranged on the encapsulation layer; and in the cutting region, the protective film is arranged on the planarization layer.

In an exemplary embodiment, the cutting mark layer of the cutting region includes a plurality of cutting marks, and the cutting marks include four rectangular patterns arranged in two rows and two columns.

The present disclosure provides a display motherboard. By retaining a complete planarization layer in the cutting region, the display motherboard effectively improves the overall rigidity of the film layer in the cutting region by retaining a complete planarization layer in the cutting region, reduces the deformation caused by the roller pressure, and avoids the generation of bubbles in the cutting region, thereby avoiding the situation that the cutting marks cannot be identified because the bubbles block the cutting marks.

Figure 2:
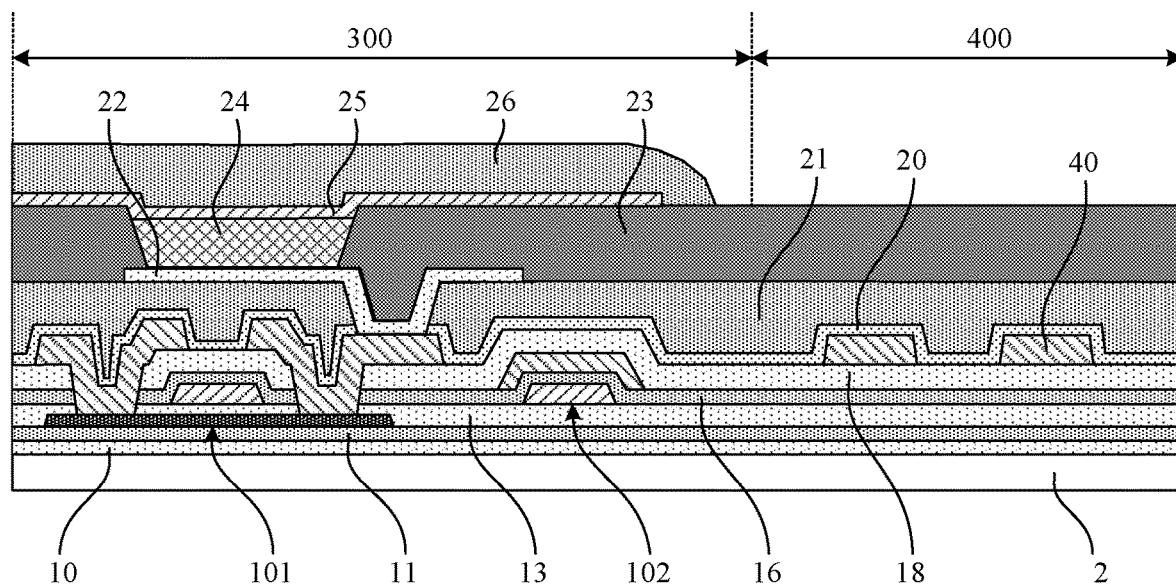
FIG. 2 is a schematic structural diagram of a display motherboard according to the present disclosure.

FIG. 2 is a schematic structural diagram of a display motherboard according to the present disclosure, which shows a cross-sectional structure of a display substrate region and a cutting region of a single source-drain metal layer (single SD or 1SD) structure. In a plane direction parallel to the display motherboard, the display motherboard includes a display substrate region 300 and a cutting region 400, and the cutting region 400 is a region other than the display substrate region 300 on the display motherboard. As shown in FIG. 2, in a plane direction perpendicular to the display motherboard, the display substrate region 300 includes a driving structure layer arranged on a base substrate 10 and a light-emitting structure layer arranged on the driving structure layer, and the cutting region 400 includes a composite insulating layer arranged on the base substrate 10, a cutting mark layer arranged on the composite insulating layer and an insulating layer covering the cutting mark layer. The driving structure layer of the display substrate region 300 includes a plurality of thin film transistors and storage capacitors forming a pixel driving circuit, which is illustrated by FIG. 2 with only one driving thin film transistor 101 and one storage capacitor 102 as an example. The driving structure layer includes a first insulating layer 11 arranged on the base substrate 10, a driving thin film transistor 101 and a storage capacitor 102 arranged on the first insulating layer 11, and a fifth insulating layer 20 and a second planarization layer 21 covering the driving thin film transistor 101 and the storage capacitor 102. The light-emitting device includes an anode 22, a pixel definition layer 23, an organic light-emitting layer 24, a cathode 25 and an encapsulation layer 26. The composite insulating layer of the cutting region 400 includes a first insulating layer 11, a second insulating layer 13, a third insulating layer 16 and a fourth insulating layer 18 which are sequentially stacked on the base substrate 10. The cutting mark layer includes a mark block 40 arranged on the composite insulating layer. The insulating layer of the cutting region 400 includes a fifth insulating layer 20 covering the cutting mark layer, a second planarization layer 21 and a pixel definition layer 23 covering the second planarization layer 21. As shown in FIG. 2, the second planarization layer 21 and the pixel definition layer 23 in the cutting region 400 are completely retained, and the surface on the side away from the base substrate 10 is flush, which effectively improves the overall rigidity of the film layer in the cutting region.

The structure of the display motherboard is described below through an example of a preparation process of the display motherboard. The "patterning process" mentioned in the present disclosure includes the treatments, such as film layer deposition, photoresist coating, mask exposure, development, etching, and photoresist stripping. Deposition may be implemented by any one or more of sputtering, evaporation, and chemical vapor deposition, coating may be implemented by any one or more of spraying and spin coating, and etching may be implemented by any one or more of dry etching and wet etching. A "thin film" refers to a layer of thin film manufactured by deposition or coating of a certain material on a substrate base. If the "thin film" does not need a patterning process during the whole manufacturing process, the "thin film" may also be called a "layer". If the "thin film" needs a patterning process throughout the whole manufacturing process, it is referred to as a "thin film" before the patterning process and as a "layer" after the patterning process. The "layer" subsequent to the patterning process contains at least one "pattern". In the present disclosure, "a and b are arranged on the same layer" means that a and b are formed at the same time by the same patterning process.

(1) A flexible base substrate 10 is prepared on a glass carrier plate 1. The flexible base substrate 10 includes a first flexible material layer, a first inorganic material layer, a semiconductor layer, a second flexible material layer and a second inorganic material layer which are stacked on the glass carrier plate 1. Materials of the first and second flexible material layers may include polyimide (PI), polyethylene terephthalate (PET) or polymer soft film after surface treatment, and materials of the first and second inorganic material layers may include silicon nitride (SiNx) or silicon oxide (SiOx) to improve the anti-water-oxygen capability of the base substrate. The first and second inorganic material layers may also be called barrier layers, and amorphous silicon (a-si) may be used as a material of the semiconductor layer. In an exemplary embodiment, taking a stacked structure of PI1/Barrier1/a-si/PI2/Barrier2 as an example, the manufacturing process may include the following acts: a layer of polyimide is coated on the glass carrier plate which cures into a film to form a first flexible (PI1) layer; subsequently, a layer of barrier thin film is deposited on the first flexible layer to form a first barrier (Barrier 1) layer capping the first flexible layer; then a layer of amorphous silicon thin film is deposited on the first barrier layer to form an amorphous silicon (a-si) layer covering the first barrier layer; then a layer of polyimide is coated on the amorphous silicon layer which cures into a film to form a second flexible (PI2) layer; then a layer of barrier thin film is deposited on the second flexible layer to form a second barrier (Barrier 2) layer capping the second flexible layer and preparation of the flexible base substrate is thus finished.

(2) Patterns of a driving structure layer and a cutting mark layer are prepared on the base substrate 10. The driving structure layer is arranged in the display substrate region 300, and the cutting mark layer is arranged in the cutting region 400. The driving structure layer includes a driving thin film transistor 101 and a storage capacitor 102 which constitute a pixel driving circuit. In an exemplary embodiment, the preparation process of the driving structure layer and the cutting mark layer may include:

A first insulating thin film and an active layer thin film are sequentially deposited on the base substrate 10, and the active layer thin film is patterned by a patterning process to form a first insulating layer 11 covering the entire base substrate 10 and an active layer 12 pattern arranged on the first insulating layer 11, the active layer 12 being formed in the display substrate region 300. After this patterning process, the cutting region 400 includes the first insulating layer 11 arranged on the base substrate 10.

Then, a second insulating thin film and a first metal thin film are sequentially deposited, and the first metal thin film is patterned by a patterning process to form a second insulating layer 13 covering the entire base substrate 10 and a first gate metal layer pattern arranged on the second insulating layer 13, the first gate metal layer pattern being formed in the display substrate region 300 and including at least a gate electrode 14, a first capacitor electrode 15, a first gate line (not shown) and a second gate line (not shown). After this patterning process, the cutting region 400 includes the first insulating layer 11 and the second insulating layer 13 stacked on the base substrate 10.

Then, a third insulating thin film and a second metal thin film are sequentially deposited, and the second metal thin film is patterned by a patterning process to form a third insulating layer 16 covering the entire base substrate 10 and a second gate metal layer pattern arranged on the third insulating layer 16, the second gate metal layer pattern being formed in the display substrate region 300 and including at least a second capacitor electrode 17, the position of which corresponds to that of the first capacitor electrode 15. After this patterning process, the cutting region 400 includes the first insulating layer 11, the second insulating layer 13 and the third insulating layer 16 stacked on the base substrate 10.

Then, a fourth insulating thin film is deposited and patterned by a patterning process to form a fourth insulating layer 18 pattern covering the entire base substrate 10, the fourth insulating layer 18 is provided with two first via holes. The two first via holes are formed in the display substrate region 300 at a position corresponding to the position of two ends of the active layer 12. The fourth insulating layer 18, the third insulating layer 16 and the second insulating layer 13 in the first via holes are etched away to expose the surface of the active layer 12. After this patterning process, the cutting region 400 includes the first insulating layer 11, the second insulating layer 13, the third insulating layer 16 and the fourth insulating layer 18 stacked on the base substrate 10.

Then, a third metal thin film is deposited and patterned by a patterning process to form patterns of a source-drain metal layer and a cutting mark layer on the fourth insulating layer 18. The first source-drain metal layer (SD1) is formed in the display substrate region 300 and includes at least a source electrode 19A, a drain electrode 19B, a data line (not shown) and a power line (not shown). The source electrode 19A and the drain electrode 19B are respectively connected with the active layer 12 through first via holes. The cutting mark layer is formed in the cutting region 400 and includes at least two marking blocks 40 arranged at intervals. After this patterning process, the cutting region 400 includes a composite insulating layer arranged on the base substrate 10 and a cutting mark layer arranged on the composite insulating layer. The composite insulating layer includes a first insulating layer 11, a second insulating layer 13, a third insulating layer 16 and a fourth insulating layer 18. The cutting mark layer includes marking blocks 40.

Then, a fifth insulating thin film is deposited to form a fifth insulating layer 20 pattern covering the entire base substrate 10. After this patterning process, the cutting region 400 includes a composite insulating layer arranged on the base substrate 10, a cutting mark layer arranged on the composite insulating layer, and a fifth insulating layer 20 arranged on the cutting mark layer. The composite insulating layer includes a first insulating layer 11, a second insulating layer 13, a third insulating layer 16 and a fourth insulating layer 18 which are stacked. The cutting mark layer includes marking blocks 40. In an exemplary embodiment, the fifth insulating layer 20 may not be formed according to actual needs.

Figure 3:
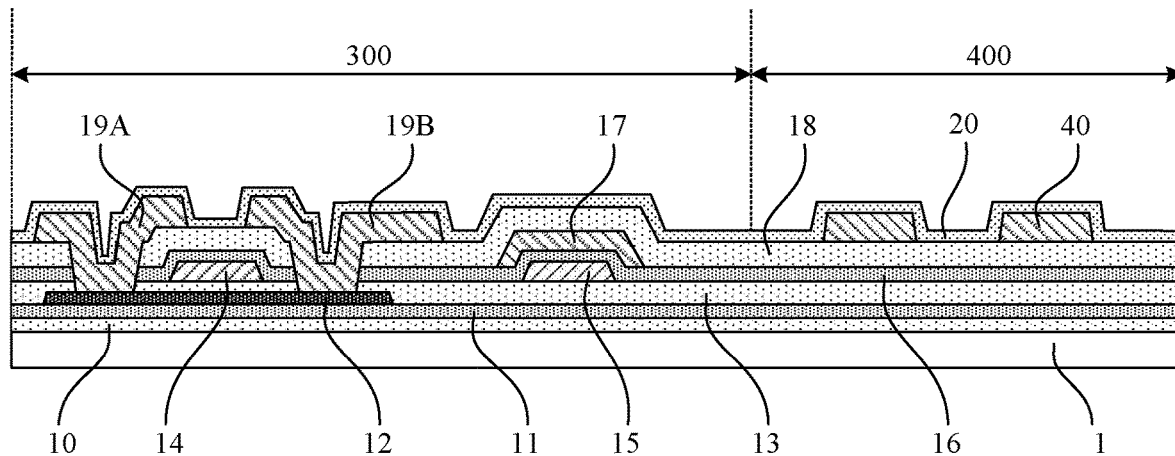
FIG. 3 is a schematic diagram of a structure of a display motherboard after patterns of a driving structure layer and a cutting mark layer are formed according to the present disclosure.

At this point, the patterns of the driving structure layer and the cutting mark layer are prepared on the base substrate 10, which is as shown in FIG. 3. The active layer 12, the gate electrode 14, the source electrode 19A and the drain electrode 19B constitute a thin film transistor 101, the first capacitor electrode 15 and the second capacitor electrode 17 constitute a storage capacitor 102, and the first source-drain metal layer and the cutting mark layer are arranged on the same layer and formed by the same patterning process.

The first insulating film, the second insulating film, the third insulating film, the fourth insulating film and the fifth insulating film may be made of silicon oxide (SiOx), silicon nitride (SiNx) and silicon oxynitride (SiON), and may have a single-layer structure or a multi-layer composite structure. The first insulating layer is called a buffer layer used for improving the anti-water-oxygen capability of the base substrate, the second insulating layer and the third insulating layer are called gate insulating (GI) layers, the fourth insulating layer is called an interlayer dielectric (ILD) layer, and the fifth insulating layer is called a passivation (PVX) layer. The first metal thin film, the second metal thin film and the third metal thin film may be made of a metal material, such as silver (Ag), copper (Cu), aluminum (Al), or molybdenum (Mo); or an alloy material consisting of metals, such as aluminum neodymium alloy (AlNd) or molybdenum niobium alloy (MoNb). The alloy material may have a single-layer structure, or a multi-layer composite structure, such as a composite structure constituted by Mo layer, Cu layer and Mo layer. The active layer thin film may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the present disclosure is applicable to thin film transistors that are manufactured based on oxide technology, silicon technology or organic technology.

Figure 4:
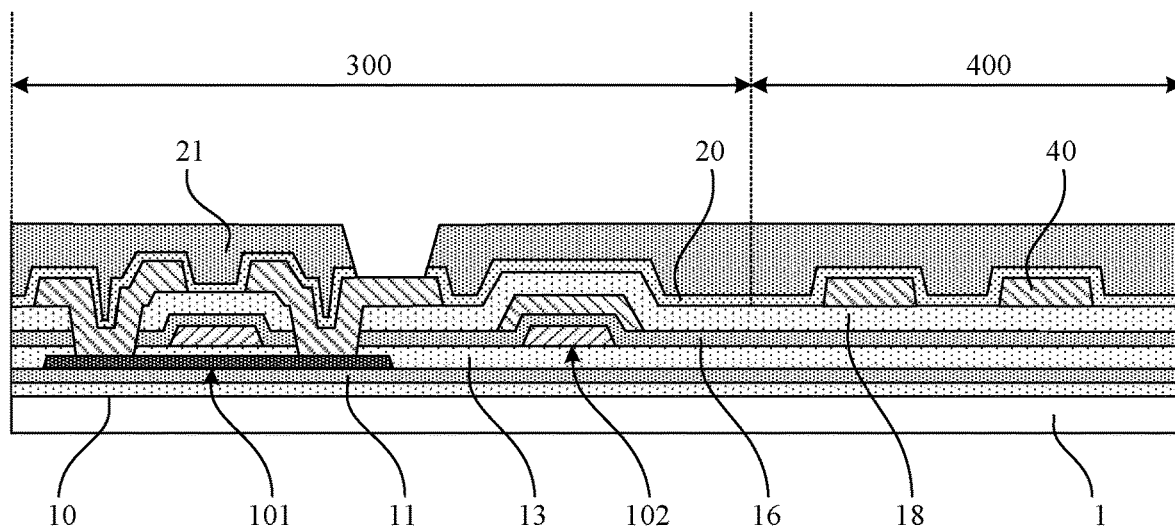
FIG. 4 is a schematic diagram of a structure of a display motherboard after a pattern of a planarization layer is formed according to the present disclosure.

(3) A flat thin film is coated on the base substrate with the above patterns formed thereon, and a fifth insulating layer 20 is patterned by a patterning process to form a second planarization (PLN) layer 21 covering the entire base substrate 10. The fifth insulating layer 20 and the second planarization layer 21 are provided with a second via hole. The second via hole is formed in the display substrate region 300. The second planarization layer 21 and the fifth insulating layer 20 are removed to expose a surface of the drain electrode 19B, as shown in FIG. 4. In this process, the second planarization layer 21 in the cutting region 400 corresponding to the position of the cutting mark layer is retained, the second planarization layer 21 in the cutting region 400 has a flat surface, and the thickness of the second planarization layer 21 in the cutting region 400 is the same as that in the display substrate region 300. After this patterning process, the cutting region 400 includes a composite insulating layer arranged on the base substrate 10, a cutting mark layer arranged on the composite insulating layer, a fifth insulating layer 20 covering the cutting mark layer, and a second planarization layer 21 covering the fifth insulating layer 20.

Figure 5:
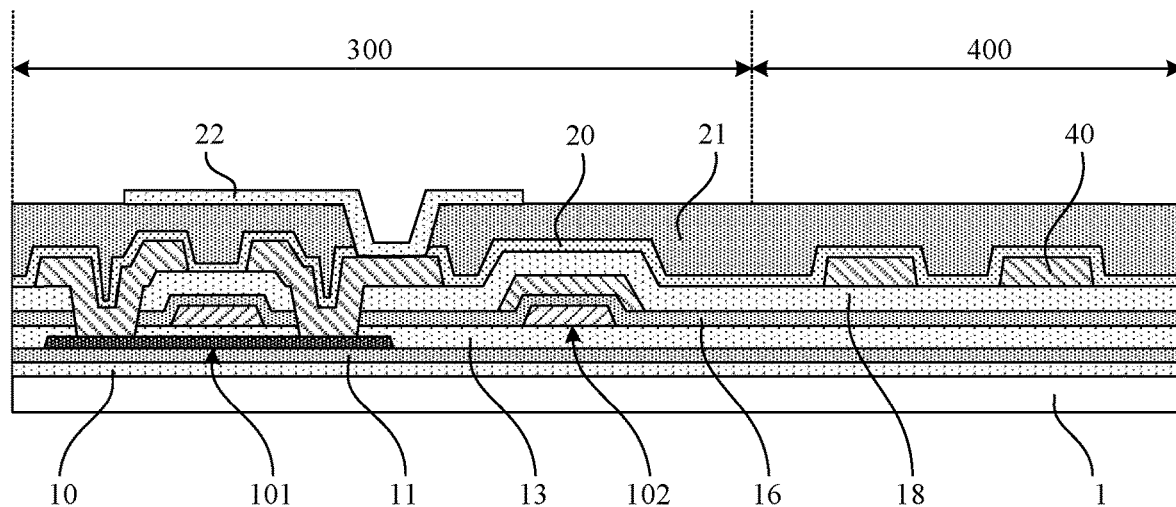
FIG. 5 is a schematic diagram of a structure of a display motherboard after a pattern of an anode is formed according to the present disclosure.

(4) On the base substrate with the above patterns formed thereon, a transparent conductive film is deposited and patterned by a patterning process to form a pattern of an anode 22 on the second planarization layer 21. The anode 22 is formed in the display substrate region 300 and is connected with the drain electrode of the thin film transistor 101 through the second via hole, as shown in FIG. 5. The transparent conductive thin film may be made of indium tin oxide (ITO) or indium zinc oxide (IZO). After this patterning process, the cutting region 400 includes a composite insulating layer arranged on the base substrate 10, a cutting mark layer arranged on the composite insulating layer, a fifth insulating layer 20 covering the cutting mark layer, and a second planarization layer 21 covering the fifth insulating layer 20.

Figure 6:
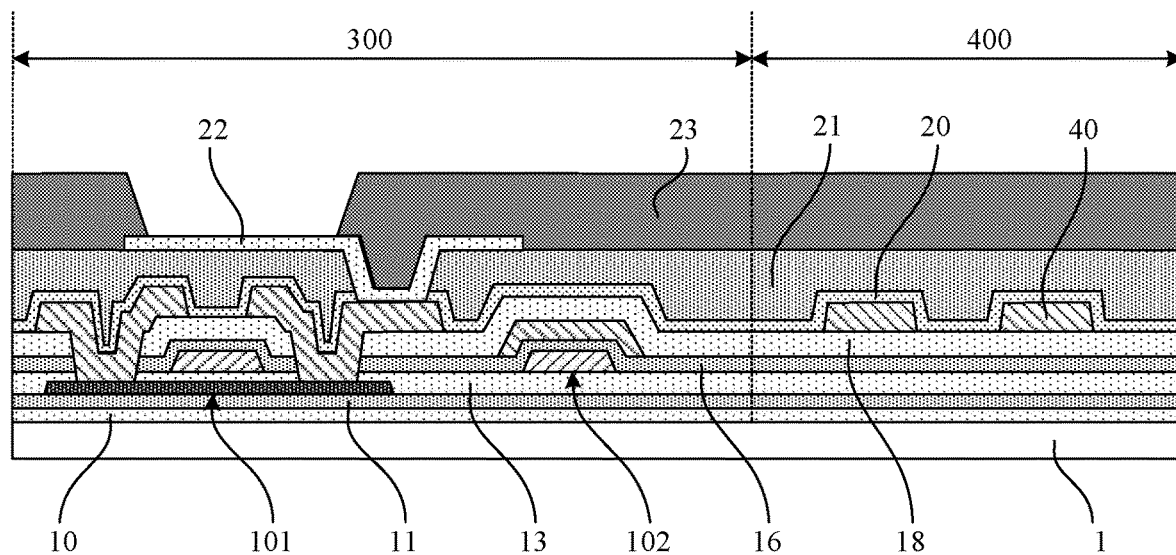
FIG. 6 is a schematic diagram of a structure of a display motherboard after a pattern of a pixel definition layer is formed according to the present disclosure.

(5) A pixel definition film is coated on the base substrate with the above patterns formed thereon, to form a pattern of a pixel definition layer (PDL) 23 through masking, exposure and development processes. The pixel definition layer 23 is provided with a pixel opening, and the pixel opening is formed in the display substrate region 300. A pixel definition film within the pixel opening is developed away to expose a surface of the anode 22, as shown in FIG. 6. Polyimide, acrylic, or polyethylene terephthalate may be used for the pixel definition layer. In this process, the pixel definition film at a position of the pixel opening is developed away, and the pixel definition film in the cutting region 400 corresponding to a position of the cutting mark layer is retained. Therefore, the pixel definition layer 23 in the cutting region 400 has a flat surface, and the thickness of the pixel definition layer 23 in the cutting region 400 is the same as that in the display substrate region 300. After this patterning process, the cutting region 400 includes a composite insulating layer arranged on the base substrate 10, a cutting mark layer arranged on the composite insulating layer, a fifth insulating layer 20 covering the cutting mark layer, a second planarization layer 21 covering the fifth insulating layer 20, and a pixel definition layer 23 covering the second planarization layer 21. The second planarization layer 21 and the pixel definition layer 23 in the cutting region 400 constitute a planarization layer covering the marking structure layer.

(6) In the subsequent process, firstly an organic light-emitting layer 24, a cathode 25 and an encapsulation layer 26 are sequentially formed in the display substrate region 300, then the display motherboard is stripped off from the glass carrier plate 1 by a stripping process, and a back film 2 is attached to the back surface of the display motherboard (a surface of one side of the base substrate 10 away from the film layer) in a roller attaching mode, thereby completing the preparation of the display motherboard, as shown in FIG. 2. Finally, the display motherboard is cut using cutting equipment according to the cutting marks to form a plurality of display substrates.

The organic light-emitting layer may include a hole injection layer, a hole transport layer, a light-emitting layer, an electron transporting layer and an electron injection layer which are stacked, and the cathode may be made of any one of metal materials such as magnesium (Mg), silver (Ag), aluminum (Al), copper (Cu) and lithium (Li), or an alloy made of any one or more of the above metals. The encapsulation layer may be made of a laminated structure including an inorganic material layer, an organic material layer and an inorganic material layer, and the encapsulation layer only covers the display substrate region. In an exemplary embodiment, the display substrate region may further include a touch layer or touch panel arranged on the encapsulation layer and a protective layer (OC) covering the touch layer or the touch panel.

Figure 7:
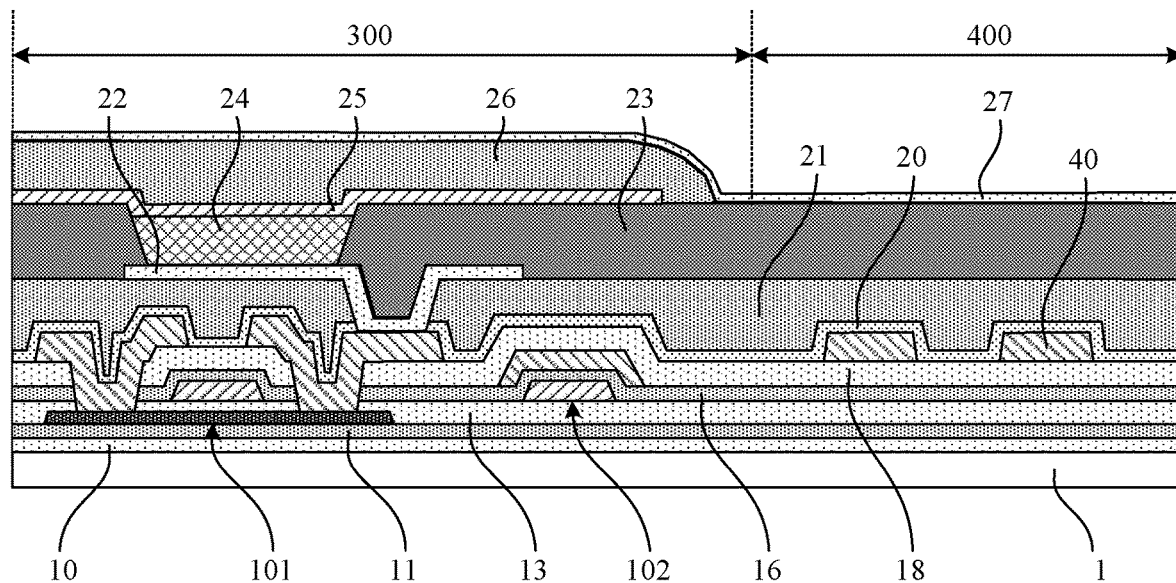
FIG. 7 is a schematic diagram of a structure of a display motherboard after a protective film is attached according to the present disclosure.

In an exemplary embodiment, the display substrate region may further include a Temporary Protect Film (TPF) 27. Subsequent to the preparation of the encapsulation layer 26, a layer of the temporary protect film 27 is attached to the display motherboard through an attaching process. In the display substrate region 300, the temporary protect film 27 is attached to the encapsulation layer, and in the cutting region 400, the temporary protect film 27 is attached to the pixel definition layer 23, which is in direct contact with the pixel definition layer 23, as shown in FIG. 7. Attaching a temporary protect film on the display motherboard may protect the film layer structure of the display substrate. After the temporary protect film 27 is attached, the display motherboard is stripped off from the glass carrier plate 1 by a stripping process, and a back film 2 is attached to the back of the display motherboard in a roller attaching mode to complete the preparation of the display motherboard. Subsequently, the display motherboard is cut using cutting equipment according to the cutting marks to form a plurality of display substrates. After cutting, the protective film is removed first, and then the touch layer and a cover plate are sequentially arranged on the encapsulation layer to form a touch display panel; or the cover plate is directly arranged on the encapsulation layer to form a display panel.

Figure 8:
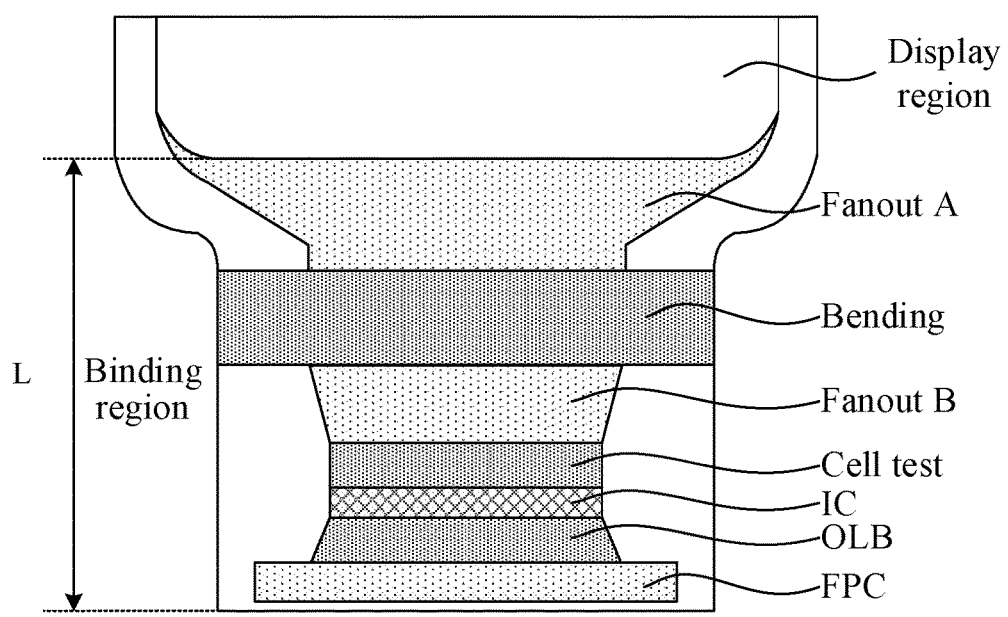
FIG. 8 is a schematic structural diagram of a binding region according to the present disclosure.

The display substrate region includes a display region and a binding region. The display region includes a plurality of pixels arranged in a matrix to realize image display, and the binding region includes a driving circuit arranged to receive control signals from an external integrated circuit and send them to a plurality of pixels in the display region. FIG. 8 is a schematic structural diagram of a binding region according to the present disclosure. Binding region is a region protruding from the display region. After the display motherboard is divided into a plurality of display substrate regions, the binding region will be bent to the back of the display region. In an exemplary embodiment, the binding region is arranged at one side of the display region. As shown in FIG. 8, the binding region includes a first fanout region (fanout A), a binding region (bending), a second fanout region (fanout B), a cell test region, an integrated circuit (IC) region, an outer lead binding (OLB) region and a flexible circuit board (FPC) region which are sequentially arranged along a direction away from the display region. In an example, a length L of the binding region (the length from the first fanout region to the flexible circuit board region) is 9 mm to 10 mm, such as 9.601 mm.

Figure 9:
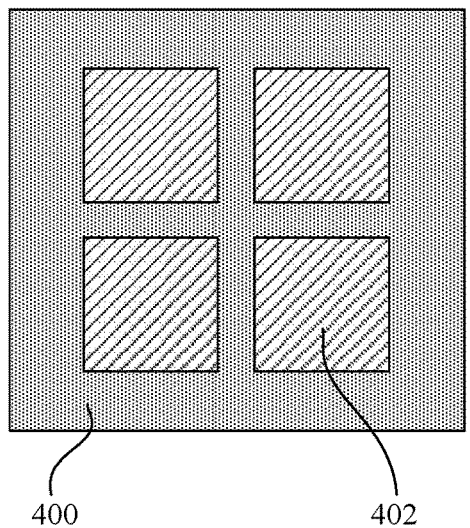
FIG. 9 is a schematic structural diagram of cutting marks according to the present disclosure.

The present disclosure proposes a cutting mark structure. FIG. 9 is a schematic structural diagram of cutting marks according to the present disclosure. As shown in FIG. 9, the cutting marks include four rectangular patterns arranged in two rows and two columns, that is, in a 2*2 matrix. Through the four rectangular patterns arranged in two rows and two columns, the influence of bubble contour or impurity contour on the shape of the cutting marks may be minimized, the accuracy of judging the shape of the cutting marks by the cutting equipment may be improved, and the situation that the cutting equipment cannot recognize the cutting marks may be avoided.

As shown in FIGS. 2-7, the display substrate plate may include:
 a base substrate 10;
 a first insulating layer 11 arranged on the base substrate 10;
 an active layer 12 arranged on the first insulating layer 11, wherein the active layer 12 is arranged in the display substrate region 300;
 a second insulating layer 13 covering the active layer 12;
 a first gate metal layer arranged on the second insulating layer 13, wherein the first gate metal layer is arranged in the display substrate region 300 and includes at least a gate electrode 14 and a first capacitor electrode 15;

a third insulating layer 16 covering the first gate metal layer;

a second gate metal layer arranged on the third insulating layer 16, wherein the second gate metal layer is arranged in the display substrate region 300 and includes at least a second capacitor electrode 17;

a fourth insulating layer 18 covering the second gate metal layer and provided with two first via holes exposing the active layer 12, wherein the two via holes are arranged in the display substrate region 300;

a first source-drain metal layer and a cutting mark layer arranged on the fourth insulating layer 18, wherein the first source-drain metal layer is arranged in the display substrate region 300 and at least includes a source electrode 19A and a drain electrode 19B which are respectively connected with the active layer 12 through the first vias; the cutting mark layer is arranged in the cutting region 400 and includes at least two mark blocks 40 arranged at intervals; the first source-drain metal layer and the cutting mark layer are arranged on the same layer and formed by the same patterning process;

a fifth insulating layer 20 and a second planarization layer 21 covering the first source-drain metal layer, on which a second via hole exposing the drain electrode 19B is provided, wherein the second via hole is arranged in the display substrate region 300; a surface of the second planarization layer 21 in the cutting region 400 away from the base substrate 10 is flush.

an anode 22 arranged on the second planarization layer 21, wherein the anode 22 is arranged in the display substrate region 300 and connected with the drain electrode 19B through the second via hole;

a pixel definition layer 23 covering the anode 22, on which a pixel opening exposing the anode 22 is provided, wherein the pixel opening is formed in the display substrate region 300; a surface of the pixel definition layer 23 in the cutting region away from the base substrate 10 is flush;

an organic light-emitting layer 24 arranged in the pixel opening of the display substrate region 300, wherein the organic light-emitting layer 24 is connected with the anode 22;

a cathode 25 arranged on the organic light-emitting layer 24, wherein the cathode 25 is connected with the organic light-emitting layer 24;

an encapsulation layer 26 arranged in the display substrate region 300; and a protective film 27 covering the aforementioned structure, wherein the protective film 27 is arranged on the encapsulation layer in the display substrate region 300 and on the pixel definition layer 23 in the cutting region 400, and the protective film 27 is in direct contact with the pixel definition layer 23.

It can be seen from the structure and preparation process of the display motherboard described above that, by retaining the complete planarization layer and the pixel definition layer in the cutting region, and arranging the cutting mark layer of the cutting region on the same layer as the first source-drain metal layer of the display substrate region, the display motherboard provided by the present disclosure is able to effectively improve the overall rigidity of the film layer in the cutting region, reduce the deformation caused by roller pressure, and avoid generation of bubbles in the cutting region, thus avoiding the situation that the cutting marks cannot be identified because bubbles block the cutting marks.

In a conventional structure, in order to reduce the cutting thickness and difficulty of a subsequent cutting process, the planarization layer and the pixel definition layer in the cutting region are both provided with grooves for exposing the fifth insulating layer. Because there is a large height difference in the position of the groove, and the deformation space of the cutting mark layer is large, when the roller presses the base substrate in the process of attaching the back film, the cutting mark layer will be greatly deformed, and then more bubbles will be formed. In the present disclosure, the height difference in the cutting region is filled by retaining the complete planarization layer and pixel definition layer, which not only increases the overall rigidity of the film layer in the cutting region, but also eliminates the deformation space of the cutting mark layer. When the roller presses the base substrate in the process of attaching the back film, the thicker planarization layer and pixel definition layer above the cutting mark layer are able to support the cutting mark layer to resist the deformation of the base substrate, which effectively reduces the deformation of the cutting mark layer and avoids the generation of bubbles, thus reducing the interference and influence of bubbles on the identification of cutting marks and avoiding the situation that the cutting marks in the cutting region cannot be identified.

In a conventional structure, the cutting mark layer is arranged on the same layer as the first gate metal layer in the display substrate region, that is, the cutting mark layer is arranged between the second insulating layer and the third insulating layer. Since only the first insulating layer and the second insulating layer are spaced between the cutting mark layer and the base substrate, the thickness and rigidity of the two insulating layers are small, and when the soft flexible base substrate is greatly deformed, the cutting mark layer will also be greatly deformed, thus forming more bubbles. In the present disclosure, by changing the cutting mark layer from the first gate metal layer to the first source-drain metal layer so that the cutting mark layer is arranged on the same layer as the first source-drain metal layer in the display substrate region, that is, the cutting mark layer is arranged on the fourth insulating layer, four insulating layers, including the first insulating layer, the second insulating layer, the third insulating layer and the fourth insulating layer, are spaced between the cutting mark layer and the base substrate, thus increasing the thickness and rigidity of the film layer between the cutting mark layer and the base substrate. In this way, even if the flexible base substrate is greatly deformed, the four insulating layers with large thickness and rigidity may resist partial deformation of the base substrate, thus reducing the deformation of the cutting mark layer and the number of bubbles to a certain extent.

In addition, the preparation process of the present disclosure may be achieved by using mature preparation equipment, with little process improvement, high compatibility, simple process realization, easy implementation, high production efficiency, low production cost, and high yield rate. In a word, the scheme of the present disclosure avoids the situation that the cutting mark of the cutting region cannot be identified, ensures the accuracy and reliability of the cutting process, and has a good application prospect.

Figure 10:
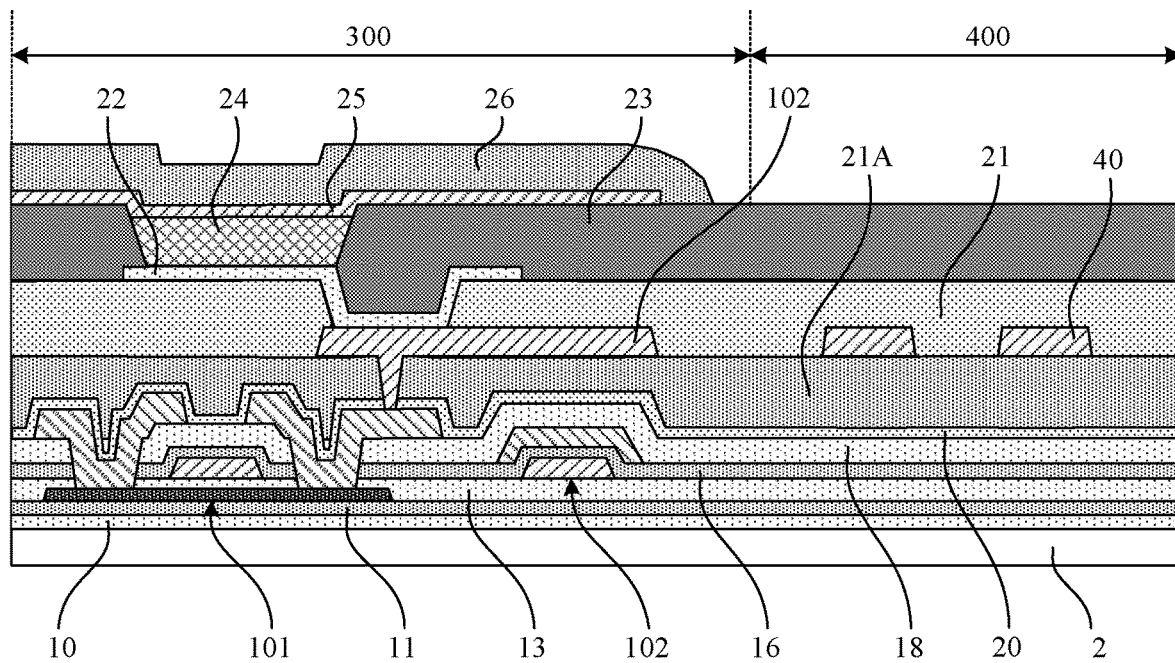
FIG. 10 is a schematic structural diagram of another display motherboard according to the present disclosure.

FIG. 10 is a schematic structural diagram of another display motherboard according to the present disclosure, which shows a cross-sectional structure of a display substrate region and a cutting region of a double source-drain metal layer (double SD or 2SD) structure. As shown in FIG. 10, the display motherboard includes a display substrate region 300 and a cutting region 400, wherein the display substrate region 300 includes a driving structure layer arranged on a base substrate 10 and a light-emitting structure layer arranged on the driving structure layer, and the cutting region 400 includes a composite insulating layer arranged on the base substrate 10, a cutting mark layer arranged on the composite insulating layer and an insulating layer covering the cutting mark layer. The driving structure layer of the display substrate region 300 includes a plurality of thin film transistors and storage capacitors forming a pixel driving circuit, which is illustrated by FIG. 8 with only one driving thin film transistor 101 and one storage capacitor 102 as an example. The driving structure layer includes a first insulating layer 11 arranged on the base substrate 10, a thin film transistor 101 and a storage capacitor 102 arranged on the first insulating layer 11, a fifth insulating layer 20 and a first planarization layer 21A covering the thin film transistor 101 and the storage capacitor 102, a second metal conductive layer arranged on the first planarization layer 21A and a second planarization layer 21 covering the second metal conductive layer, wherein the second metal conductive layer includes a connection electrode 103 connected with a drain electrode of the thin film transistor 101. The light-emitting device includes an anode 22, a pixel definition layer 23, an organic light-emitting layer 24, a cathode 25 and an encapsulation layer 26. The composite insulating layer of the cutting region 400 includes a first insulating layer 11, a second insulating layer 13, a third insulating layer 16, a fourth insulating layer 18, a fifth insulating layer 20 and a first planarization layer 21A which are sequentially stacked on the base substrate 10. The cutting mark layer includes a mark block 40 arranged on the composite insulating layer, and the insulating layer includes a second planarization layer 21 covering the cutting mark layer and a pixel definition layer 23 covering the second planarization layer 21. The second planarization layer 21 and the pixel definition layer 23 in the cutting region 400 constitute a planarization layer covering the marking structure layer. As shown in FIG. 10, the second planarization layer 21 and the pixel definition layer 23 in the cutting region 400 are completely retained, and the surface on the side away from the base substrate 10 is flush, which effectively improves the overall rigidity of the film layer in the cutting region.

The preparation process of the present disclosure may include following steps:

(11) A base substrate 10 is formed on a glass carrier plate 1, and the preparation process is the same as the process (1).

(12) Patterns of a driving structure layer and a cutting mark layer are prepared on the base substrate 10, including: sequentially forming a first insulating layer 11, an active layer 12, a second insulating layer 13, a first gate metal layer, a third insulating layer 16, a second gate metal layer, a fourth insulating layer 18 and a first source-drain metal layer on the base substrate 10. The processing procedure is similar to the previous processing procedure, except that when patterning the third metal thin film, only the first source-drain metal layer pattern is formed in the display substrate region 300, and no cutting mark layer is formed in the cutting region 400.

Then, a fifth insulating layer 20 and a first planarization layer 21A covering the first source-drain metal layer are formed, a third via hole is provided on the fifth insulating layer 20 and the first planarization layer 21A, and the third via hole is formed in the display substrate region 300, exposing a surface of the drain electrode 19B. Then, a fourth metal thin film is deposited and patterned by a patterning process to form a second metal conductive layer and a cutting mark layer on the first planarization layer 21A. The second metal conductive layer is formed in the display substrate region 300, and the cutting mark layer is formed in the cutting region 400 and includes at least two mark blocks 40 arranged at intervals. The first source-drain metal layer includes at least a source electrode 19A, a drain electrode 19B and a data line, and the second metal conductive layer includes a connection electrode 103 connected with a drain electrode 19B through a third via hole. After this patterning process, the cutting region 400 includes a composite insulating layer arranged on the base substrate 10 and a cutting mark layer arranged on the composite insulating layer. The composite insulating layer includes a first insulating layer 11, a second insulating layer 13, a third insulating layer 16, a fourth insulating layer 18, a fifth insulating layer 20 and a first planarization layer 21A. The cutting mark layer includes marking blocks 40. In an exemplary embodiment, according to actual needs, the second metal conductive layer may further include any one or more of a power supply line (VDD), a low voltage line (VSS), a compensation line and an auxiliary cathode.

Figure 11:
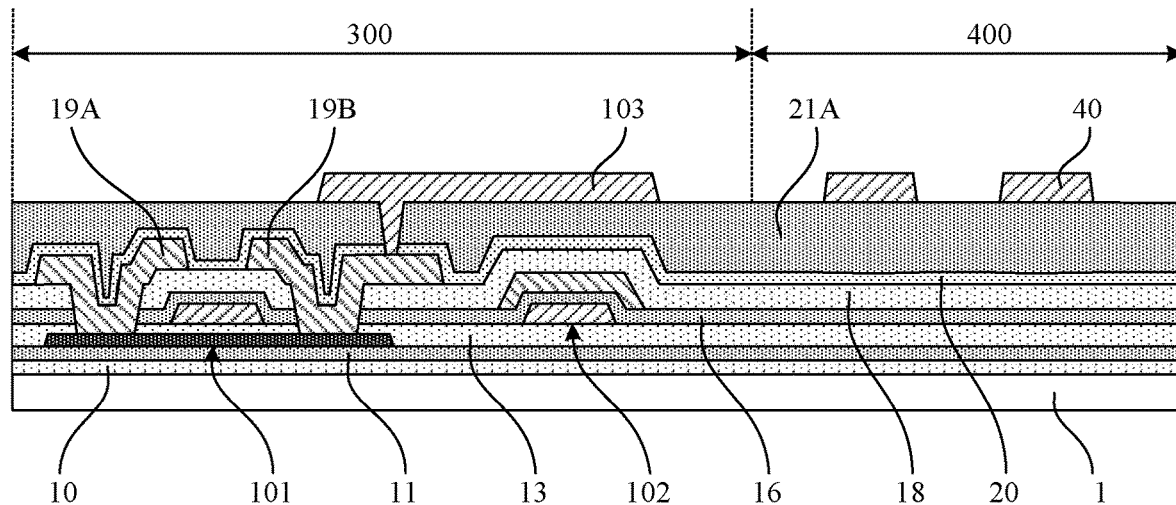
FIG. 11 is a schematic diagram of a structure of another display motherboard after patterns of a driving structure layer and a cutting mark layer are formed according to the present disclosure.

So far, the patterns of the driving structure layer and the cutting mark layer are prepared on the base substrate 10, which is as shown in FIG. 11. The active layer 12, the gate electrode 14, the source electrode 19A and the drain electrode 19B constitute the thin film transistor 101, the first capacitor electrode 15 and the second capacitor electrode 17 constitute the storage capacitor 102. The first source-drain metal layer includes at least the source electrode 19A and the drain electrode 19B, and the second metal conductive layer includes at least the connection electrode 103. The second metal conductive layer and the cutting mark layer are arranged on the same layer, and are formed by the same patterning process.

Figure 12:
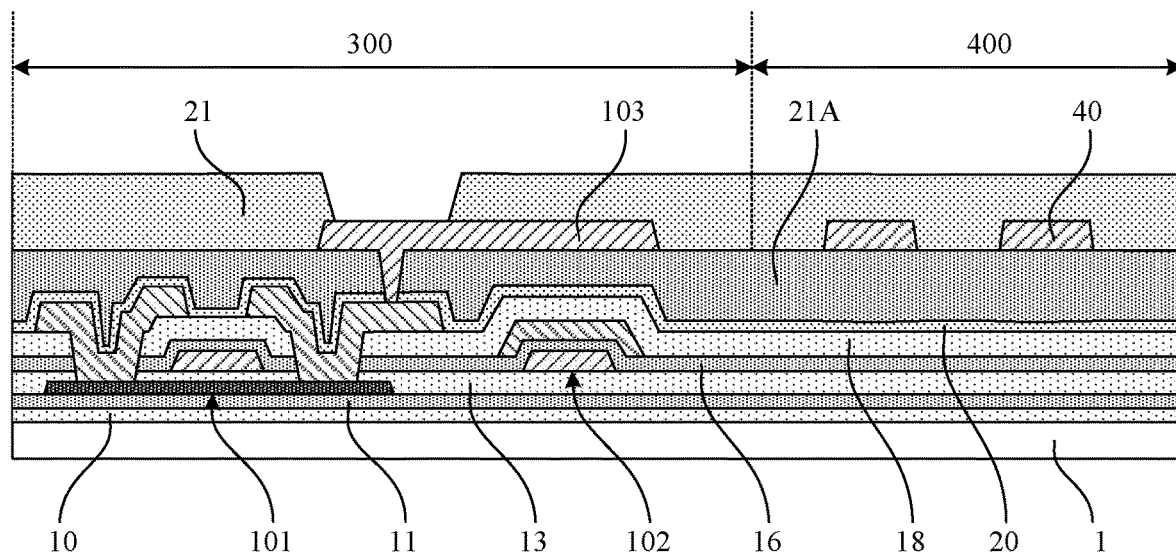
FIG. 12 is a schematic diagram of a structure of another display motherboard after a pattern of a planarization layer is formed according to the present disclosure.

(13) A flat thin film is coated on the base substrate with the above patterns formed thereon to form a second planarization layer 21 covering the entire base substrate 10 through masking, exposure and development processes. The second planarization layer 21 is provided with a fourth via hole. The fourth via hole is formed in the display substrate region 300. The flat thin film in the fourth via hole is developed to expose a surface of the connection electrode 103, as shown in FIG. 12. In this process, the flat thin film at the position of the fourth via hole is developed, and the second planarization layer 21 in the cutting region 400 corresponding to the position of the cutting mark layer is retained. Therefore, the second planarization layer 21 in the cutting region 400 has a flat surface, and the thickness of the second planarization layer 21 in the cutting region 400 is the same as that in the display substrate region. After this patterning process, the cutting region 400 includes a composite insulating layer arranged on the base substrate 10, a cutting mark layer arranged on the composite insulating layer, and a second planarization layer 21 covering the cutting mark layer.

(14) An anode 22, a pixel definition layer 23, an organic light-emitting layer 24, a cathode 25 and an encapsulation layer 26 are sequentially formed on the base substrate with the aforementioned patterns formed thereon. The preparation process is the same as the aforementioned processes (4) to (6), and the subsequent processes of attaching the protective film, stripping off from the glass carrier plate, attaching the back film and cutting are the same as the aforementioned processes, which are not repeated here.

As shown in FIGS. 10 to 12, the display motherboard may include:

a base substrate 10;

a first insulating layer 11 arranged on the base substrate 10;

an active layer 12 arranged on the first insulating layer 11, wherein the active layer 12 is arranged in the display substrate region 300;

a second insulating layer 13 covering the active layer 12;

a first gate metal layer arranged on the second insulating layer 13, wherein the first gate metal layer is arranged in the display substrate region 300 and includes at least a gate electrode 14 and a first capacitor electrode 15;

a third insulating layer 16 covering the first gate metal layer;

a second gate metal layer arranged on the third insulating layer 16, wherein the second gate metal layer is arranged in the display substrate region 300 and includes at least a second capacitor electrode 17;

a fourth insulating layer 18 covering the second gate metal layer and provided with two first via holes exposing the active layer 12, wherein the two via holes are arranged in the display substrate region 300;

a first source-drain metal layer arranged on the fourth insulating layer 18, wherein the first source-drain metal layer is arranged in the display substrate region 300 and includes at least a source electrode 19A and a drain electrode 19B, and the source electrode 19A and the drain electrode 19B are respectively connected with the active layer 12 through the first via hole;

a fifth insulating layer 20 and a first planarization layer 21A covering the first source-drain metal layer, on which a third via hole exposing the drain electrode 19B is provided, wherein the third via hole is arranged in the display substrate region 300;

a second metal conductive layer and a cutting mark layer arranged on the first planarization layer 21A, wherein the second metal conductive layer is arranged in the display substrate region 300, and includes at least a connection electrode 103, which is connected with the drain electrode 19B through the third via hole; the cutting mark layer is arranged in the cutting region 400 and includes at least two mark blocks 40 arranged at intervals; the second metal conductive layer and the cutting mark layer are arranged on the same layer and formed by the same patterning process;

a second planarization layer 21 covering the second metal conductive layer, on which a fourth via hole exposing the connection electrode 103 is provided, wherein the fourth via hole is arranged in the display substrate region 300; a surface of the second planarization layer 21 in the cutting region 400 away from the base substrate 10 is flush;

an anode 22 arranged on the second planarization layer 21, wherein the anode 22 is formed in the display substrate region 300 and connected with the connection electrode 103 through the fourth via hole;

a pixel definition layer 23 covering the anode 22, on which a pixel opening exposing the anode 22 is provided, wherein the pixel opening is formed in the display substrate region 300; a surface of the pixel definition layer 23 in the cutting region 400 away from the base substrate 10 is flush;

an organic light-emitting layer 24 arranged in the pixel opening of the display substrate region 300, wherein the organic light-emitting layer 24 is connected with the anode 22;

a cathode 25 arranged on the organic light-emitting layer 24, wherein the cathode 25 is connected with the organic light-emitting layer 24; and an encapsulation layer 26 arranged in the display substrate region 300.

Since the cutting mark layer is arranged on the same layer as the second metal conductive layer in the display substrate region, that is, the cutting mark layer is arranged on the first planarization layer, a total of six insulating layers, including the first insulating layer, the second insulating layer, the third insulating layer, the fourth insulating layer, the fifth insulating layer, and the first planarization layer, are spaced between the cutting mark layer and the base substrate, which increases the thickness and rigidity of the film layer between the cutting mark layer and the base substrate, reduces the deformation of the cutting mark layer, reduce the number of bubbles, and avoids the situation that the cutting mark of the cutting region cannot be identified to the greatest extent.

Figure 13:
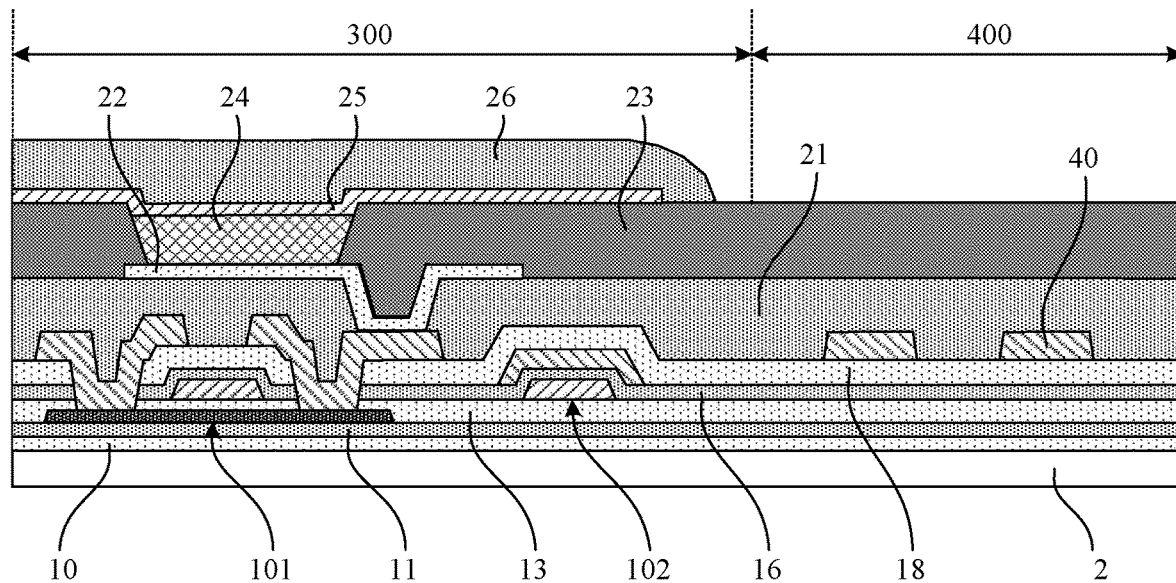
FIG. 13 is a schematic structural diagram of another display motherboard according to the present disclosure.

FIG. 13 is a schematic structural diagram of another display motherboard according to the present disclosure, and is an extension of the structure shown in FIG. 2. Different from the display motherboard shown in FIG. 2, after the driving structure layer and the cutting mark layer are formed in the display substrate region 300 and the cutting region 400 respectively, the second planarization layer 21 is directly formed on the driving structure layer and the cutting mark layer, that is, the display motherboard is not provided with a fifth insulating layer.

Figure 14:
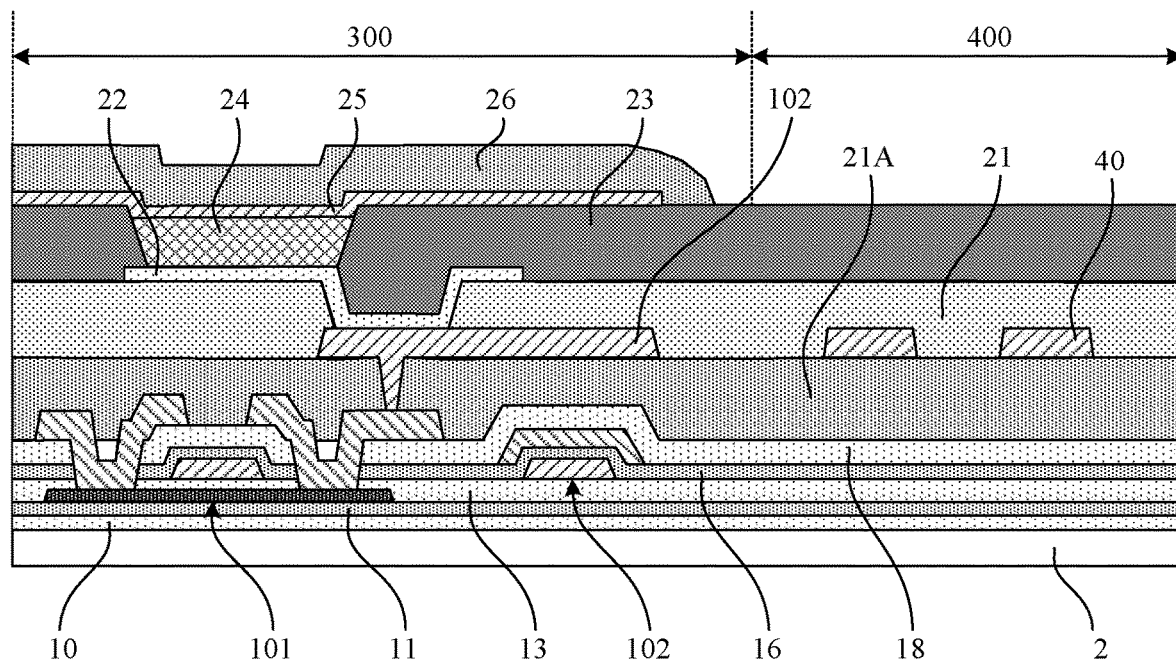
FIG. 14 is a schematic structural diagram of another display motherboard according to the present disclosure.

FIG. 14 is a schematic structural diagram of another display motherboard according to the present disclosure, and is an extension of the structure shown in FIG. 10. Different from the display motherboard shown in FIG. 10, subsequent to the formation of the first source-drain metal layer, the first planarization layer 21A covering the first source-drain metal layer is directly formed, that is, the display motherboard is not provided with a fifth insulating layer.

The structure shown in the present disclosure and the preparation process thereof are merely an exemplary description. In an exemplary implementation, corresponding structures may be changed and patterning processes may be added or reduced according to actual needs. For example, an OLED may have a top emission structure, or may have a bottom emission structure. For another example, the driving thin film transistor may have a top gate structure, or a bottom gate structure, or may be a single gate structure, or a dual gate structure. For another example, other electrodes or leads may further be arranged in the driving structure layer and the light-emitting structure layer, which is not specifically limited here in the present disclosure.

The present disclosure further provides a preparation method of a display motherboard. The display motherboard includes a plurality of display substrate regions and a cutting region located at a periphery of each of the plurality of display substrate regions; the preparation method includes steps of:

S1, respectively forming a driving structure layer and a marking structure layer in the plurality of display substrate regions and the cutting region, wherein the marking structure layer includes a cutting mark layer; and S2, forming a planarization layer on the driving structure layer and the marking structure layer, wherein the planarization layer covers the marking structure layer.

In an exemplary embodiment, the driving structure layer includes a first source-drain metal layer, and the marking structure layer includes a cutting mark layer. Step S1 includes:

forming a first insulating layer on a base substrate, forming an active layer on the first insulating layer, forming a second insulating layer covering the active layer, forming a first gate metal layer on the second insulating layer, forming a third insulating layer covering the first gate metal layer, forming a second gate metal layer on the third insulating layer, forming a fourth insulating layer covering the second gate metal layer, and forming the first source-drain metal layer and the cutting mark layer on the fourth insulating layer by the same patterning process; wherein the active layer, the first gate metal layer, the second gate metal layer and the first source-drain metal layer are arranged in the display substrate region, and the cutting mark layer is arranged in the cutting region.

In an exemplary embodiment, step S2 includes:
forming a fifth insulating film on the driving structure layer and the marking structure layer; and
forming a second planarization layer and a pixel definition layer sequentially on the fifth insulating layer, wherein an anode is further formed between the second planarization layer and the pixel definition layer in the display substrate region.

In an exemplary embodiment, the driving structure layer includes a second source-drain metal layer, and the marking structure layer includes a cutting mark layer. Step S1 includes:
forming a first insulating layer on a base substrate, forming an active layer on the first insulating layer, forming a second insulating layer covering the active layer, forming a first gate metal layer on the second insulating layer, forming a third insulating layer covering the first gate metal layer, forming a second gate metal layer on the third insulating layer, forming a fourth insulating layer covering the second gate metal layer, forming the first source-drain metal layer on the fourth insulating layer, forming a fifth insulating layer covering the first source-drain metal layer, forming a first planarization layer on the fifth insulating layer, and forming the second source-drain metal layer and the cutting mark layer on the first planarization layer by the same patterning process; wherein the active layer, the first gate metal layer, the second gate metal layer, the first source-drain metal layer and the second source-drain metal layer are arranged in the display substrate region, and the cutting mark layer is arranged in the cutting region.

In an exemplary embodiment, step S2 includes:
forming a second planarization layer and a pixel definition layer sequentially on the first planarization layer, wherein an anode is further formed between the second planarization layer and the pixel definition layer in the display substrate region.

In an exemplary embodiment, subsequent to the formation of the pixel definition layer on the planarization layer, the preparation method further includes:
forming an organic light-emitting layer, a cathode and an encapsulation layer;
attaching a protective film on the encapsulation layer, wherein the protective film is in contact with the pixel definition layer in the cutting region;
attaching a back film on a surface of one side of the base substrate away from the planarization layer in a roller attaching mode; and
cutting the display motherboard to form a plurality of display substrates.

In an exemplary embodiment, after cutting the display motherboard, the preparation method further includes:
removing the protective film; and
forming a cover plate on the encapsulation layer; or sequentially forming a touch control layer and a cover plate on the encapsulation layer.

The present disclosure provides a preparation method of a display motherboard. By retaining the complete planarization layer and the pixel definition layer in the cutting region, and arranging the cutting mark layer of the cutting region on the same layer as the first source-drain metal layer of the display substrate region, this method effectively improves the overall rigidity of the film layer in the cutting region, reduces the deformation caused by roller pressure, avoids generation of bubbles in the cutting region, thus avoiding the situation that the cutting marks cannot be identified because bubbles block the cutting marks, and ensuring the accuracy and reliability of the cutting process. In addition, the preparation process of the present disclosure may be achieved by using mature preparation equipment, with little process improvement, high compatibility, simple process realization, easy implementation, high production efficiency, low production cost, and high yield rate, and therefore has a good application prospect.

The present disclosure further provides a display substrate, which is formed by cutting the display motherboard along the cutting region.

The present disclosure further provides a display device, including the display substrate described above. The display device may be a mobile phone, a tablet computer, a television, a display, a laptop computer, a digital photo frame, a navigator, or another product or component with a display function.

Although the embodiments disclosed in the present disclosure are as described above, the described contents are only the embodiments for facilitating understanding of the present disclosure, which are not intended to limit the present disclosure. Any person skilled in the field to which the present disclosure pertains may make any modifications and variations in the forms and details of implementation without departing from the spirit and the scope disclosed by the present disclosure. However, the patent protection scope of the present disclosure shall still be subject to the scope defined in the appended claims.

What is claimed is:

1. A display motherboard, comprising a plurality of display substrate regions and a cutting region located at a periphery of each of the plurality of display substrate regions; wherein the display motherboard further comprises:
   a driving structure layer arranged in each of the plurality of display substrate regions and a marking structure layer arranged in each cutting region, wherein the marking structure layer comprises a cutting mark layer; and
   a planarization layer arranged on the driving structure layer and the marking structure layer, and covering the marking structure layer;
   wherein the driving structure layer comprises a first source-drain metal layer, and the cutting mark layer is arranged on the same layer as the first source-drain metal layer, and the driving structure layer further comprises: a first insulating layer arranged on a base substrate, an active layer arranged on the first insulating layer, a second insulating layer covering the active layer, a first gate metal layer arranged on the second insulating layer, a third insulating layer covering the first gate metal layer, a second gate metal layer arranged on the third insulating layer, and a fourth insulating layer covering the second gate metal layer; wherein the first source-drain metal layer is arranged on the fourth insulating layer, the marking structure layer further comprises: a first insulating layer, a second insulating layer, a third insulating layer and a fourth insulating layer which are stacked on the base substrate, and the cutting mark layer is arranged on the fourth insulating layer; or wherein the driving structure layer comprises a second source-drain metal layer, and the cutting mark layer is arranged on the same layer as the second source-drain metal layer, and the driving structure layer further comprises: a first insulating layer arranged on a base substrate, an active layer arranged on the first insulating layer, a second insulating layer covering the active layer, a first gate metal layer arranged on the second insulating layer, a third insulating layer covering the first gate metal layer, a second gate metal layer arranged on the third insulating layer, a fourth insulating layer covering the second gate metal layer, a first source-drain metal layer arranged on the fourth insulating layer, and a fifth insulating layer and a first planarization layer covering the first source-drain metal layer, wherein the second source-drain metal layer is arranged on the first planarization layer; the marking structure layer further comprises a first insulating layer, a second insulating layer, a third insulating layer, a fourth insulating layer, a fifth insulating layer and a first planarization layer which are stacked on the base substrate, and the cutting mark layer is arranged on the first planarization layer.

2. The display motherboard according to claim 1, further comprising a fifth insulating layer which is arranged on the driving structure layer in the display substrate region, and arranged on the marking structure layer in the cutting region, wherein the planarization layer is arranged on the fifth insulating layer.

3. The display motherboard according to claim 2, wherein the planarization layer comprises a second planarization layer arranged on the fifth insulating layer and a pixel definition layer arranged on the second planarization layer; and an anode is further arranged between the second planarization layer and the pixel definition layer in the display substrate region.

4. The display motherboard according to claim 1, wherein the planarization layer comprises a second planarization layer covering the driving structure layer and the marking structure layer and a pixel definition layer arranged on the second planarization layer; an anode is further arranged between the second planarization layer and the pixel definition layer in the display substrate region.

5. The display motherboard according to claim 1, further comprising a protective film; wherein in the display substrate region, an encapsulation layer is arranged on the planarization layer, and the protective film is arranged on the encapsulation layer; and in the cutting region, the protective film is arranged on the planarization layer.

6. The display motherboard according to claim 1, wherein the cutting mark layer of the cutting region comprises a plurality of cutting marks, and each of the cutting marks comprises four spaced rectangular patterns arranged in two rows and two columns.

7. A display substrate formed by cutting the display motherboard according to claim 1 along the cutting region.

8. A display device, comprising the display substrate according to claim 7.

9. A preparation method of a display motherboard, wherein the display motherboard comprises a plurality of display substrate regions and a cutting region located at a periphery of each of the plurality of display substrate regions; the preparation method comprises steps of:

respectively forming a driving structure layer and a marking structure layer in the plurality of display substrate regions and the cutting region, wherein the marking structure layer comprises a cutting mark layer; and forming a planarization layer on the driving structure layer and the marking structure layer, wherein the planarization layer covers the marking structure layer;

wherein the driving structure layer comprises a first source-drain metal layer; and the step of respectively forming the driving structure layer and the marking structure layer in the plurality of display substrate regions and the cutting region comprises: forming a first insulating layer on a base substrate, forming an active layer on the first insulating layer, forming a second insulating layer covering the active layer, forming a first gate metal layer on the second insulating layer, forming a third insulating layer covering the first gate metal layer, forming a second gate metal layer on the third insulating layer, forming a fourth insulating layer covering the second gate metal layer, and forming the first source-drain metal layer and the cutting mark layer on the fourth insulating layer by the same patterning process; wherein the active layer, the first gate metal layer, the second gate metal layer and the first source-drain metal layer are arranged in the display substrate region, and the cutting mark layer is arranged in the cutting region; or, wherein the driving structure layer comprises a second source-drain metal layer; and the step of respectively forming the driving structure layer and the marking structure layer in the plurality of display substrate regions and the cutting region comprises: forming a first insulating layer on a base substrate, forming an active layer on the first insulating layer, forming a second insulating layer covering the active layer, forming a first gate metal layer on the second insulating layer, forming a third insulating layer covering the first gate metal layer, forming a second gate metal layer on the third insulating layer, forming a fourth insulating layer covering the second gate metal layer, forming the first source-drain metal layer on the fourth insulating layer, forming a fifth insulating layer covering the first source-drain metal layer, forming a first planarization layer on the fifth insulating layer, and forming the second source-drain metal layer and the cutting mark layer on the first planarization layer by the same patterning process; wherein the active layer, the first gate metal layer, the second gate metal layer, the first source-drain metal layer and the second source-drain metal layer are arranged in the display substrate region, and the cutting mark layer is arranged in the cutting region.

10. The preparation method according to claim 9, wherein the step of forming the planarization layer on the driving structure layer and the marking structure layer comprises:

forming a fifth insulating film on the driving structure layer and the marking structure layer; and forming a second planarization layer and a pixel definition layer sequentially on the fifth insulating layer, wherein an anode is further formed between the second planarization layer and the pixel definition layer in the display substrate region.

11. The preparation method according to claim 9, wherein the step of forming the planarization layer on the driving structure layer and the marking structure layer comprises:

forming a second planarization layer and a pixel definition layer sequentially on the first planarization layer, wherein an anode is further formed between the second planarization layer and the pixel definition layer in the display substrate region.

12. The preparation method according to claim 9, further comprising:
- sequentially forming an organic light-emitting layer, a cathode and an encapsulation layer;
- attaching a protective film on the encapsulation layer, wherein the protective film is in contact with the pixel definition layer in the cutting region;
- attaching a back film on a surface of one side of the base substrate away from the planarization layer in a roller attaching mode; and
- cutting the display motherboard to form a plurality of display substrates.

13. The preparation method according to claim 12, wherein after cutting the display motherboard, the preparation method further comprises:
- removing the protective film; and
- forming a cover plate on the encapsulation layer; or sequentially forming a touch control layer and a cover plate on the encapsulation layer.

* * * * *